(12) United States Patent
Knapp

(10) Patent No.: US 7,268,368 B1
(45) Date of Patent: Sep. 11, 2007

(54) SEMICONDUCTOR PACKAGE HAVING OPTICAL RECEPTACLES AND LIGHT TRANSMISSIVE/OPAQUE PORTIONS AND METHOD OF MAKING SAME

(75) Inventor: David J. Knapp, Austin, TX (US)

(73) Assignee: Standard Microsystems Corporation, Hauppauge, NY (US)

( * ) Notice: Subject to any disclaimer, the term of this patent is extended or adjusted under 35 U.S.C. 154(b) by 312 days.

(21) Appl. No.: 10/651,884

(22) Filed: Aug. 29, 2003

(51) Int. Cl.
*H01L 31/12* (2006.01)

(52) U.S. Cl. .................. 257/80; 257/79; 257/98; 257/100; 257/E31.095; 438/22; 438/29; 438/48; 438/57; 438/64; 438/65

(58) Field of Classification Search .............. 385/88, 385/89, 90, 91, 92, 93, 94; 257/81, 79, 80, 257/82, 83, 84, 85
See application file for complete search history.

(56) References Cited

U.S. PATENT DOCUMENTS

| | | | |
|---|---|---|---|
| 3,976,877 A * | 8/1976 | Thillays | |
| 5,113,466 A | 5/1992 | Acarlar et al. | |
| 5,123,066 A | 6/1992 | Acarlar | |
| 5,275,765 A | 1/1994 | Go et al. | |
| 5,337,398 A | 8/1994 | Benzoni et al. | |
| 5,857,050 A | 1/1999 | Jiang et al. | |
| 6,015,239 A * | 1/2000 | Moore | |
| 6,143,588 A | 11/2000 | Glenn | |
| 6,341,898 B1 * | 1/2002 | Matsushita | 385/88 |
| 6,355,881 B1 | 3/2002 | Braeges et al. | |
| 6,508,970 B2 | 1/2003 | Chandra | |
| 6,632,030 B2 * | 10/2003 | Jiang et al. | |
| 2003/0059178 A1 * | 3/2003 | Kobayashi et al. | |

* cited by examiner

*Primary Examiner*—Sue A. Purvis
*Assistant Examiner*—Kevin Quinto
(74) *Attorney, Agent, or Firm*—Kevin L. Daffer; Daffer McDaniel, LLP

(57) ABSTRACT

A semiconductor package and method for forming the same is disclosed herein. The semiconductor package includes a package support member, a pair of optoelectronic devices spaced from each other and coupled to the package support member, and an optically transmissive portion for separately encapsulating the pair of optoelectronic devices. A pair of lenses is formed as a unibody structure with the optically transmissive portion. The semiconductor package also includes an optically opaque portion, which extends between and around the separately encapsulated devices to optically isolate encapsulated optical devices. The optically opaque portion also extends outward from portions of the encapsulated devices, thereby forming a pair of fiber optic receptacles as a unibody structure with the optically opaque portion. By forming lensing elements and fiber optic receptacles in such a manner, the present method provides an easier and more accurate means by which to passively align optical conductors to underlying encapsulated optical devices.

18 Claims, 5 Drawing Sheets

SEMICONDUCTOR PACKAGE HAVING OPTICAL RECEPTACLES AND LIGHT TRANSMISSIVE/OPAQUE PORTIONS AND METHOD OF MAKING SAME

BACKGROUND OF THE INVENTION

1. Field of the Invention

This invention relates to semiconductor packages and, more particularly, to a semiconductor package comprising an optically transmissive portion, which separately encapsulates a pair of optoelectronic devices, and an optically opaque portion, which encapsulates the optically transmissive portion to optically isolate the pair of optoelectronic devices.

2. Description of the Related Art

The following descriptions and examples are not admitted to be prior art by virtue of their inclusion within this section.

Optoelectronic devices are becoming increasingly common in automotive, consumer, medical, computer, and telecommunication applications due, in part, to the advantages of optical versus electrical signal transmission. For example, optoelectronic technologies have contributed significant advancements to the telecommunications industry by providing higher data rate and bandwidth capabilities than earlier wire-based technologies. Optoelectronic technologies also demonstrate lower electromagnetic interference ("EMI") sensitivity and emissions, lower loss interconnections and lower susceptibility to distance related parasitics.

Optoelectronic interconnects relay electronic signals from one location to another using light as a carrier frequency for the signal transmission. Systems employing optoelectronic interconnects are generally composed of a number of building blocks, including optical sources (i.e., "transmitters" or "emitters," such as light-emitting diodes (LEDs), lasers or photodiodes), transmitter circuitry (e.g., a driver circuit), optical transmission media (e.g., free-space, optical fibers or waveguides), optical detectors (i.e., "receivers" or "photodetectors," such as PIN diodes) and receiver circuitry (e.g., amplifier or decision circuits). Though many high-performance optoelectronic interconnects have been developed for use within the telecommunications industry, they are not typically suitable for many applications (e.g., consumer-electronics) because of packaging and driver requirements, space needs, heat-dissipation problems, or cost.

Packaging requirements, in particular, play a dominant role in determining the suitability of optoelectronic interconnects within consumer-related applications. For example, an active optical device (e.g., an emitter or photodetector) may be attached to a mount in alignment with a package support member (e.g., a substrate or leadframe). The package support member may include a spherical lensing element for coupling the optical device to an optical fiber arranged above a sensing surface of the optical device. The arrangement of the mounted optical device, the package support member and the lens is generally referred to as an optical subassembly, or OSA. In some cases, the electronic circuitry required for operating the optical device may be separately assembled and coupled to the OSA by conventional means (typically by electrical leads). The supporting electronic circuitry may then be enclosed within a housing, which is separate from an enclosure surrounding the OSA, with only the leads of the support circuitry exposed for connecting to the OSA.

Packaging optical devices and support circuitry within separate packages may be beneficial in some cases. For example, separate package designs provide the ability to interchange the support circuitry required for different electronic signals, such as TTL or ECL signals. Unfortunately, a major disadvantage of separate package designs is the overall size of the resultant package. In particular, the amount of space required to accommodate separate optical and electronic packages is significant. However, the cost involved in making two separate packages is even more significant—especially so in the cost-conscious consumer electronics market. Not only must each package be separately manufactured and maintained, but having two packages might require the optical package not maintain a power supply as would be the case in the electronic package. If the circuitry within the electronic package is defective, the optical package absent a power supply cannot bypass operation of its associated, defective electronic circuitry.

In an effort to overcome the above-mentioned problems, package designs have evolved to combine optical devices and support circuitry within a single package. These single package designs have attempted to minimize the space consumption and electrical parasitics plagued by separate package designs. In general, single package designs may include a package support member (e.g., a substrate or leadframe) upon, or within which, the optical and electronic components are coupled. One or more optical receptacles may be attached to the package support member for receiving one or more optical fiber connectors. In some cases, a lensing element may be included within the package support member or within the optical receptacles to provide optical coupling between the optical device and the optical fiber. Alternatively, the optical fiber may be a "lensed fiber," and may include a lensing element at one end thereof. Subsequently, portions of the package support member and the optical receptacles may be enclosed within a housing to provide structural rigidity to the semiconductor package. In this manner, signal transmission may occur successfully if the optical receptacles are precisely aligned to the optical devices within the package.

Unfortunately, conventional single package designs suffer from several disadvantages. For example, fabrication problems may exist with respect to mating the various parts of the packaged device (i.e., the housing, the package support member and the optical receptacles). Conventional means of attaching the various parts have included a solder process and a temperature cured epoxy process. These processes require relatively high curing temperatures, and thus, often cause significant thermal expansion within package parts fabricated from thermally conductive materials (e.g., ceramic substrates, metal lead frames, metal housings, etc.). As such, misalignment between an optical receptacle (and thus, an optical fiber) and an optical device may result due to thermal expansion and contraction of the various parts during the high temperature curing/adhesion process and subsequent cooling process.

In any case, securing an optical receptacle to the package typically involves an "active" alignment process. In other words, the alignment of one end of an optical fiber may be adjusted until an optical device detects light emitted from an optical source arranged at an opposite end of the fiber. Unfortunately, active alignment is often time consuming, inefficient and unacceptably expensive for use in manufacturing computer interconnects. For example, an unnecessary number of manufacturing steps is required to separately fabricate and assemble the various parts of the packaged device; these additional steps tend to increase manufacturing costs.

Therefore, a need exists for a fiber-based optoelectronic package, which simplifies current packaging techniques by reducing the number of manufacturing steps, in addition to providing passive alignment between the optical receptacles and optical devices. The cost of manufacturing such a package would be significantly reduced compared to the cost of manufacturing conventional dual optical/electronic packages or packages having receptacles coupled to the package housing.

SUMMARY OF THE INVENTION

The problems outlined above may be in large part addressed by a semiconductor package, and more particularly, to a fiber-based optoelectronic package formed according to a simplified manufacturing process. The semiconductor package preferably incorporates the receptacles into the package as the package is being manufactured. Moreover, the receptacles along with the package itself encompass both the optical device and the electronic device.

According to one embodiment, the semiconductor package described herein may include an optically transmissive material and an optically opaque material. The optically transmissive material partially surrounds the optical and electronic devices, and the optically opaque material may partially surround the optically transmissive material. The opaque materials is formed into the shape of the receptacles, and is adapted to secure an optical conductor (e.g., an optical fiber) in alignment over a portion of the optically transmissive material that does not abut with nor is super adjacent to the optically opaque materials. In other words the transmissive material encapsulates the optical receiver and transmitter portions of the optical devices and, particularly, the opaque material does not cover a portion of the transmissive material. The portion not covered by the opaque material is the portion aligned with an opening of the receptacle so that the optical fiber, when operational, shines light through the transmissive material and onto the receiver. Conversely, light from the transmitter traverses the transmissive material and extends into the optical fiber secured to a corresponding receptacle whose opening is directly above the transmissive material absent the opaque material.

The integrated circuit that is at least partially surrounded by the optically transmissive material may include an optoelectronic device, such as an optoelectronic transmitter (e.g., a laser, LED or photodiode) or an optoelectronic receiver (e.g., a photodetector or PIN diode). The optoelectronic device preferably includes a surface that is super adjacent (i.e., abuts against with substantially no gap therebetween) the portion of the optically transmissive material not surrounded by or adjacent to the optically opaque material. Thus, the surface of the optoelectronic device may be an optical sensing surface, and the portion of the optically transmissive material not having the optically opaque material on its immediate outer surface may include a lens. The lens may be formed having a top surface spaced from the optical sensing surface by a focal length of the lens. The focal length of the lens is thereby a function of the thickness of the transmissive material in the region of void of any overlying opaque material.

Both the optically transmissive material and the optically opaque material may be comprised can be inserted as a fluid but, when cured, forms a solid. The optically transmissive material is substantially transparent to the wavelength (or wavelengths) of light detected (or emitted) by the packaged optoelectronic device. The optically transmissive material may also be suitable for use within a relatively low pressure, low temperature molding process. For example, the optically transmissive material may be comprised of a thermosetting polymer.

Similarly, the optically opaque material may be comprised of a thermosetting polymer, or plastic. The opaque material substantially prevents transmission of the wavelength (or wavelengths) of light detected (or emitted) by the packaged optoelectronic device. The optically opaque material may also be suitable for use in a relatively high pressure, high temperature molding process.

In some cases, there may be two (or more) optical devices. If so, then two (or more) receptacles with accompanying transmissive materials will be needed. In instances where the package includes two optical devices, such as a transmitter and a receiver, the optically transmissive material surrounding both devices can have the same or dissimilar transmissive characteristics. If it is desired that the transmissive characteristics be different, then the semiconductor package may include a first transmissive material partially surrounding, e.g., the transmitter and a second transmissive material partially surrounding, e.g., the receiver. The opaque material surrounding both the first and second transmissive materials, however, can have the same degree of opaqueness.

In a preferred aspect of the invention, the optically transmissive material surrounding the first optical device and the optically transmissive material surrounding the second optical device are spaced from each other by a portion of the optically opaque material. As such, a first integrated circuit (e.g., an optoelectronic transmitter) may be mounted upon a first portion of a package support member and surrounded by the optically transmissive material. Similarly, a second integrated circuit (e.g., an optoelectronic receiver) may be mounted upon a second portion of the package support member and surrounded by the optically transmissive material. In this manner, the optically opaque material may serve to optically isolate the separately encapsulated first and second integrated circuits.

According to another embodiment, a semiconductor package is disclosed herein as including a leadframe, a pair of optical devices (e.g., an optoelectronic transmitter and an optoelectronic receiver) spaced from each other and coupled to the leadframe, and an optically transmissive portion that separately encapsulates each of the pair of optical devices. An optically opaque portion of the semiconductor package may extend between the separately encapsulated pair of optical devices. The optically opaque portion may also extend outward from a portion of each of the separately encapsulated pair of optical devices to form a pair of cylindrical receptacles having elongated axes aligned over the pair of optical devices.

In a preferred aspect of the invention, portions of the separately encapsulated pair of optical devices may include a pair of lenses, which are formed as a unibody structure with the optically transmissive portion. Forming the pair of lenses in such a manner ensures precise optical alignment between the pair of lenses and the respective pair of optical devices. In addition, the pair of lenses may be formed a focal distance away from the respective pair of optical devices and may have a radius of curvature, which allows a maximum amount of light to be emitted or detected at the operational wavelength of the optical devices.

In another preferred aspect of the invention, the pair of cylindrical receptacles is formed as a unibody structure with the optically opaque portion, such that the elongated axes of the pair of cylindrical receptacles extend through a central region of the respective pair of lenses. Forming the pair of cylindrical receptacles in such a manner provides passive alignment between the pair of cylindrical receptacles and the respective pair of lenses. In particular, the receptacles are formed outward from the know lens areas. This ensures the receptacles will always be in alignment with the pair of lenses—i.e., passive alignment is achieved without having to tweak the optical fiber after manufacture is completed. In addition, each of the pair of cylindrical receptacles may be configured for receiving a fiber optic connection. For example, an inner surface of each of the cylindrical receptacles may include a detent for palpable connection with a terminal end of a fiber optic connector. Thus, the pair of cylindrical receptacles are configured to provide precise optical alignment between fiber optic conductors and the pair of encapsulated optical devices.

The semiconductor package may further include a substantially rigid sheathing having a pair of apertures that can be brought over an outer surface of the pair of cylindrical receptacles. In some cases, the rigid sheathing may be snap fit upon an outer surface of the optically opaque portion from which the cylindrical receptacles extend. In general, the sheathing may be formed of substantially any rigid material having electrical conductive properties. The sheathing may also be formed to include a set of tabs for attachment to a printed circuit board. The set of tabs may extend outward from, and substantially flush with, an outer surface of the optically opaque portion opposite from the cylindrical receptacles. Thus, the sheathing may provide structural rigidity and electromagnetic shielding to the semiconductor package.

According to yet another embodiment, a method for fabricating a semiconductor package is disclosed herein. The present method significantly reduces the number of steps involved in forming a semiconductor package, as compared to conventional methods that separately fabricate and attach various components of the semiconductor package. In particular, the present method may include coupling a pair of optical devices onto a surface of a package support member, such as a leadframe. The method may also include inserting the device-coupled leadframe into a first mold and injecting a substantially light transmissive material around each of the pair of optical devices. As such, the method may form a separately encapsulated pair of optical devices. In some cases, the distal ends of the leadframe may remain exposed for connecting with external circuitry.

Next, the method may include inserting the leadframe (with the separately encapsulated pair of optical devices formed thereon) into a second mold. A substantially light opaque material may then be injected around each of the separately encapsulated pair of optical devices. In addition to filling a space between the separately encapsulated pair of optical devices, the step of injecting the substantially light opaque material may form a pair of receptacles that extend outward from one surface of the light transmissive material. By injecting the substantially light opaque material, the present method may provide optical isolation between the separately encapsulated optical devices, in addition to providing precise optical alignment between the optical devices and fiber optics subsequently inserted within the pair of receptacles. In some cases, a sheathing may be connected around the pair of receptacles and portions of the sheathing may be bonded to a printed circuit board.

In a preferred embodiment, the substantially light transmissive material may be injected at a first injection pressure and a first injection temperature. As such, the substantially light transmissive material may be injected during a "transfer molding process" that implements a lower temperature and injection pressure than what is known as an "injection molding process." The substantially light opaque material may then be injected at a second injection pressure and a second injection temperature associated with the injection molding process. By implementing a lower pressure and temperature of a transfer molding processing, In a preferred embodiment, the substantially light opaque material may be injected during an injection molding process, wherein the second injection pressure and temperature are substantially greater than the first injection pressure and temperature. In this manner, the present method may avoid damaging internal electrical leads by first encapsulating the pair of optical devices according to a relatively low pressure and low temperature molding process. In addition to the higher injection pressure and temperatures of the injection molding process, it is generally recognized that the injection molding process is less costly than the transfer molding process. Injection molding inserts the encapsulant under greater pressure, and therefore injection molding can form a finished product faster than transfer molding. Shortening the manufacturing cycle thereby reduces costs.

BRIEF DESCRIPTION OF THE DRAWINGS

Other objects and advantages of the invention will become apparent upon reading the following detailed description and upon reference to the accompanying drawings in which.

Figure 1:
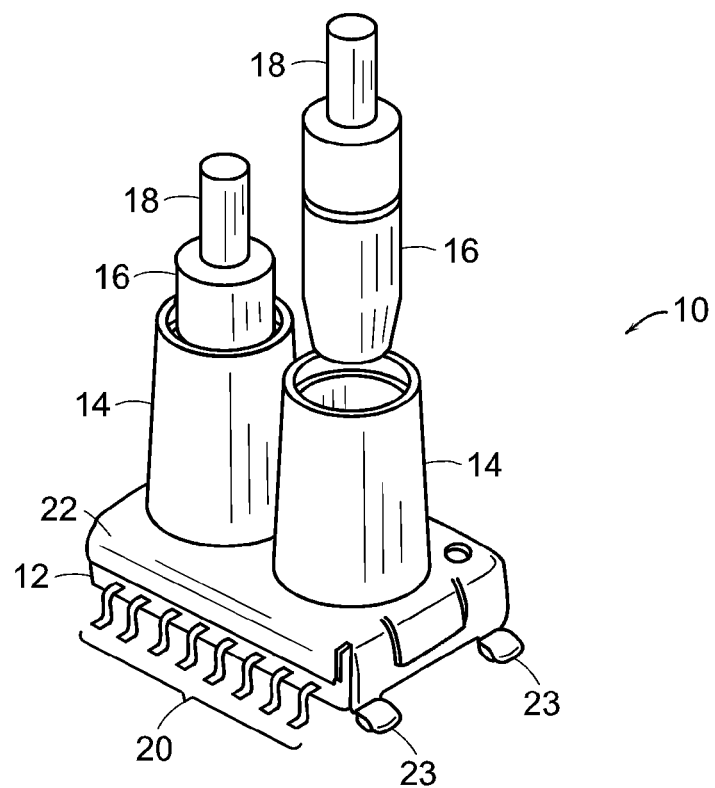
FIG. 1 is a three-dimensional view of an exemplary semiconductor package having fiber optic connectors coupled therewith.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Optoelectronic interconnects may be fabricated to provide emission, detection, modulation and/or amplification of light. In most cases, however, optoelectronic interconnects include an optical source (i.e., an "optoelectronic transmitter" or an "emitter") and/or an optical detector (i.e., an "optoelectronic receiver"), each of which is coupled to its own electronic support circuitry. In general, optoelectronic transmitters convert electrons into photons, which may then be transmitted across an optical transmission media, such as free-space, an optical fiber or waveguide. Optoelectronic receivers, on the other hand, convert photons received from the optical transmission media back into electrons.

The optical transmission media chosen for a given application is typically based on properties of the transmission path, such as path length, direction and clarity. For example, an optical signal may be transmitted through free-space when direct chip-to-chip, chip-to-board or board-to-board signal transmission is desired over relatively short, unobstructed distances. A major advantage of free-space transmission is that it does not require use of the signal backplane, thereby freeing the backplane to support other optical and/or electrical interconnections. However, free-space transmission is generally unsuitable for long distance signal transmission due to beam divergence and alignment difficulties.

Optical fibers may be used to interconnect computers in local-area networks (LANs) and other point-to-point data communications. Due, in part, to the popularity and versatility of optical fiber as a transmission medium, the discussion presented herein will focus primarily on fiber-based optoelectronic interconnects. It should be noted, however, that free-space or waveguide-based optoelectronic interconnects will also apply.

Coupling light into a fiber is the primary drawback of optical fiber transmission. In general, coupling light into a fiber requires precise alignment of both the position and angular orientation of the fiber with respect to the optical source. Most present-day alignment strategies are based on active alignment, in which the alignment of one end of an optical fiber is adjusted until light emitted from an optical source arranged at an opposite end of the fiber is detected by an optical device. Unfortunately, active alignment is often time consuming, inefficient, unreliable and unacceptably expensive for computer interconnects; thus, recent development of fiber-based optoelectronic interconnects have focused on the problem of packaging the optical source and fiber in such a way that human alignment and re-alignment is not necessary. Passive alignment is therefore needed.

One form of passive alignment is disclosed in U.S. Pat. No. 5,337,398. In general, the disclosure describes various alignment features (e.g., pyramidal detents), which are used to align pre-fabricated optical components (e.g., lenses and fiber receptacles) to optical devices (e.g., a transmitter and receiver) previously mounted upon a silicon package substrate. For example, Benzoni discloses a passive alignment process for aligning a pair of lenses to an underlying pair of optical devices. In particular, a lens holder is described as including a plurality of alignment features, which are etched into a bottom surface of the lens holder. To align the lens holder to one of the optical devices, Benzoni inserts a plurality of spherical members into the alignment features of the lens holder for providing physical contact to, and mating with, corresponding alignment features within the silicon substrate. After aligning the lens holder to the silicon substrate, Benzoni aligns a lensing element to an underlying optical device by placing the lens into an aperture of the lens holder.

Unfortunately, the passive alignment process described by Benzoni suffers from many disadvantages. In particular, the disclosed passive alignment process requires an unnecessarily large number of manufacturing steps. For example, Benzoni first performs an etching process (i.e., to form various alignment features) on each surface to be mated. Next, an optical component may be attached to the package substrate after inserting the spherical members within corresponding alignment features. This process may then be repeated for attaching each of the pre-fabricated optical components to the package substrate, resulting in a substantial number of assembly operations.

FIG. 1 illustrates a semiconductor package that employs a simpler form of passive alignment. Passive alignment is achieved using a simplified process of encasing the optical components in a fixed location relative to the package, as well as integrating the receptacles into the package itself. In this fashion, the critical features of the optical path are fixed during manufacture and the precise alignment maintained when the optical fiber is inserted into the receptacles—an optimal passive alignment solution. As will be described in more detail below, semiconductor package 10 is formed according to an improved fabrication process. The integrated circuit components are encapsulated within the package and the receptacles are formed relative to those components as the package is manufactured.

As shown in FIG. 1, semiconductor package 10 includes housing 12 and one or more optical receptacles 14, which are configured for receiving one or more fiber optic connectors 16. As will be described in more detail below, housing 12 and optical receptacles 14 are formed as a single, unibody structure, and thus, do not require subsequent attachment to one another. Preferably, semiconductor package 10 is an optoelectronic transceiver, and therefore, includes two optical receptacles 14 for transmitting and receiving optical signals via optical fibers 18. However, semiconductor package 10 may alternatively include a fewer or greater number of optical receptacles 14, as will be described in more detail below. Optical fibers 18 may be single mode or multi-mode fibers formed from glass or plastic materials, depending on the application in which they are used.

Package leads 20 may also be included within semiconductor package 10 for electrically connecting with external circuitry, such as a printed circuit board. In some cases, and as shown in FIG. 1, package leads 20 may extend from a leadframe support member for mounting upon a surface of the printed circuit board (PCB). However, package leads 20 may be alternatively configured for a thru-hole solder or wirebond connection to the PCB when using a leadframe support member, or configured for a solder bump connection when using a multi-layer substrate support member. In some cases, sheathing 22 may be attached to housing 12 for providing structural rigidity and electromagnetic interference (EMI) protection to the semiconductor package. Tabs 23 can be used to secure the sheathing to, for example, the PCB via a solder connection. Alternatively, instead of using a structurally hardened sheathing 22 (which may be made of a metal alloy), housing 12 can be extended upward flush with the upper opening of receptacles 14. The added rigidity of making the package larger such that the receptacles 14 appear simply as apertures provides an alternative to attaching a separately manufactured sheathing 22.

Figure 2:
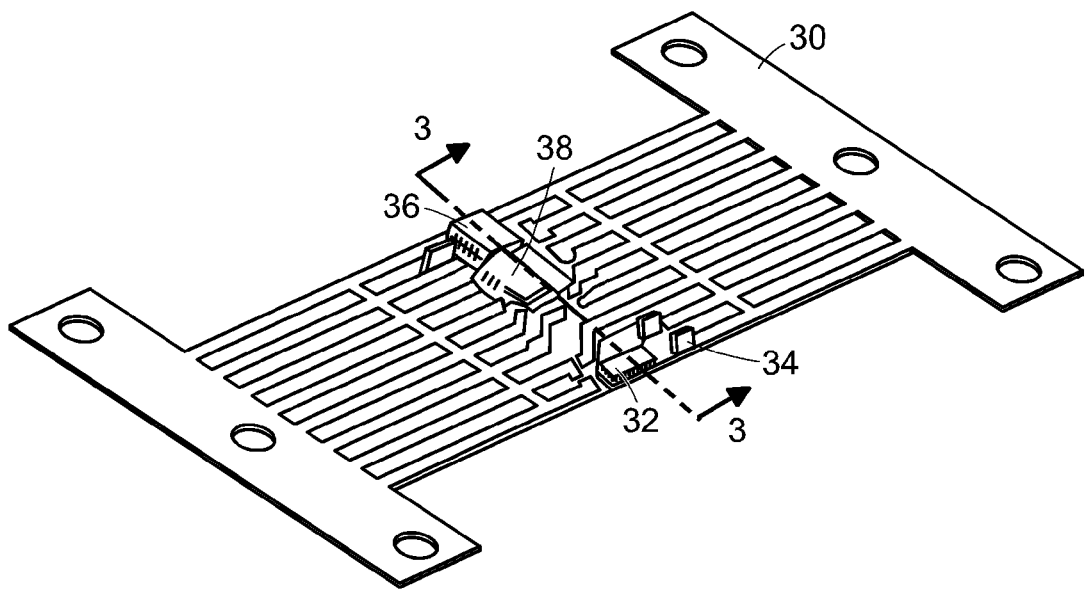
FIG. 2 is a top-view of an exemplary leadframe support member having optical and electronic devices mounted thereon.

Turning now to FIGS. 2-9, a method of forming semiconductor package 10 according to the improved fabrication process is disclosed herein. For reasons described in more detail below, it may be preferable to form semiconductor package 10 upon a leadframe support member. As such, one or more optical devices having respective electronic support circuitry may be coupled upon a surface, or paddle, of leadframe 30, as shown in FIG. 2. If more than one optical device is included within the package, the optical and electrical components may be attached in pairs to separate paddle portions of leadframe 30. Die bonding adhesives or other means of attachment known in the art may be used to attach the optical and electrical components to leadframe 30. As shown in FIG. 2, the electrical components that support an associated optical component are paired in a particular portion of the leadframe, preferably in a side-by-side configuration. However, each pair of optical and electrical components may be alternatively arranged in a stacked configuration with the optical component at least partially exposed to send/receive optical transmissions. In most cases, the optical devices are electrically coupled to their electronic support circuitry via electrical leads, or wirebonds. Alternatively, the paired optical and electrical components may be electrically coupled via any other conventional means, such as trace conductors within a substrate or leads of the leadframe.

As noted above, semiconductor package 10 is preferably an optoelectronic transceiver, and thus, may include emitter 32 having support circuitry 34, and detector 36 having support circuitry 38, as shown in FIG. 2. However, semiconductor package 10 is not necessarily limited to an optoelectronic transceiver, and may include any other means by which to emit, detect, modulate, or amplify an optical signal. For example, semiconductor package 10 may be an optoelectronic transmitter, thereby including only emitter 32 and support circuitry 34. In another example, semiconductor package 10 may be an optoelectronic receiver, thereby including only optical detector 36 and support circuitry 38. In either example, semiconductor package 10 may include only one optical receptacle 14 for transmitting or receiving an optical signal. Alternatively, semiconductor package 10 might accommodate two (or more) pairs of transceivers in order to daisy-chain a dual transmission path between networked nodes, thereby requiring two (or more) pairs of receptacles.

The optical and electrical components of semiconductor package 10 may be chosen based on the performance specifications of the resultant package. For example, emitter 32 may be a spontaneous emission device, such as a light emitting diode (LED), or a stimulated emission device, such as a laser. LEDs are generally easier and cheaper to manufacture, whereas lasers demonstrate better performance characteristics (e.g., higher efficiency, coherence and switching speed with a smaller divergence angle and line width). Though either surface-emitting or edge-emitting LEDs or lasers may be used within semiconductor package 10, emitter 32 preferably includes a surface-emitting LED for ease of manufacture, ease of coupling and cost. In some cases, emitter 32 may include a resonant cavity LED or a semiconductor LED (e.g., a GaAs- or InP-based LED). Electronic support circuitry 34 is typically a current driver circuit chosen for its compatibility with emitter 32.

Likewise, the material composition and configuration of optical detector 36 may be chosen with regard to transmission distance, as well as device efficiency, speed and ease of manufacture. For example, a material composition of optical detector 36 may be selected from any material commonly used to fabricate detectors, such as silicon (Si), gallium arsenide (GaAs) and gallium arsenide indium phosphide (GaAsInP), which have cutoff wavelengths of 1 µm, 818 nm and 1.7 µm, respectively. As such, optical detector 36 may be formed from Si or GaAs when receiving optical signals over relatively short transmission distances (e.g., in short-haul plastic fiber systems operating at or below an 818 nm wavelength). However, optical detector 36 may be formed from GaAsInP when longer transmission distances are required (e.g., in glass-fiber systems operating at wavelengths of 1.3 and 1.55 µm).

In addition, optical detector 36 may be formed having any configuration known in the art. For example, optical detector 36 may be formed as a PIN detector, a metal-semiconductor (MSM) detector, or an avalanche photodiode (APD). In general, MSM detectors are easier to manufacture and demonstrate lower capacitance than PIN detectors of similar surface area, but are usually less efficient than PIN detectors. In some cases, an APD may be used in high-bandwidth, long distance optical interconnect systems. Preferably, optical detector 36 includes a silicon junction photodiode, or PIN.

Figure 3:
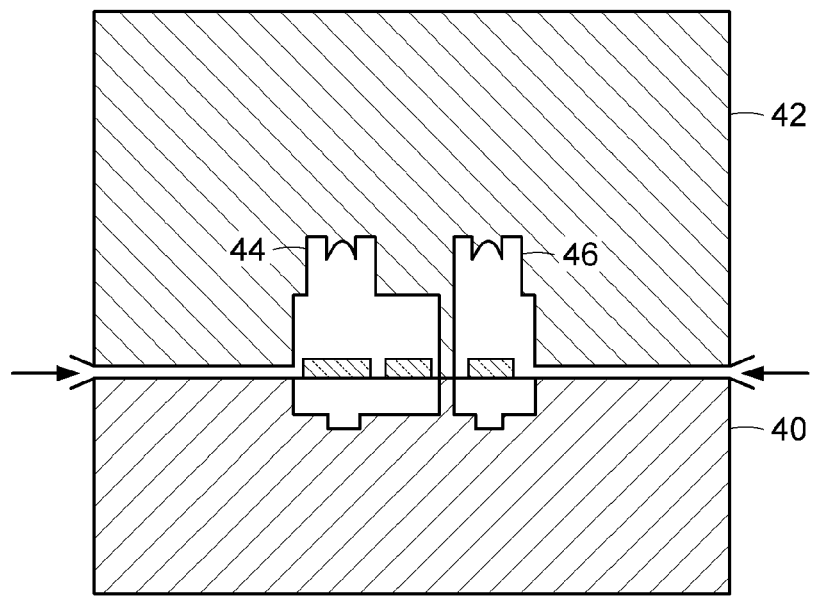
FIG. 3 is a cross-sectional view of the device-coupled leadframe, as viewed along plane 3 of FIG. 2, inserted within a first mold for separately encapsulating portions of the device-coupled leadframe with an optically transmissive material.

After the paired optical and electrical components are coupled to leadframe 30, the device-coupled leadframe is inserted within a first mold, as shown in FIG. 3. In some cases, the device-coupled leadframe may be loaded into a bottom half 40 of the first mold. The top half 42 of the first mold may be lowered, and a clamping pressure applied, to secure the device-coupled leadframe within the mold. As shown in FIG. 3, bottom half 40 and top half 42 are configured such that distinct mold cavities remain around each of the pair of optical and electrical components. Subsequently, an optically transmissive material is injected within the mold cavities, and around each pair of optical and electrical components, to form a pair of separately encapsulated optoelectronic devices 44 and 46.

In a preferred aspect of the present invention, the optically transmissive material is substantially transparent to the wavelength (or wavelengths) of light detected (or emitted) by the encapsulated optical devices. As such, the optically transmissive material may be a clear adhesive material suitable for use in a cast molding process. However, such a process is not generally preferred due to the relatively long cure time, low volume and low repeatability associated with cast molding processes.

In a preferred embodiment, the optically transmissive material is suitable for use within a relatively low-pressure, low-temperature molding process, such as a transfer molding process. In the transfer molding process, a molding compound is preheated within an auxiliary chamber (called a transfer pot) to a temperature of, for example, 32-34° C., which is below the transfer temperature (i.e., the temperature at which the molding compound is transferred from the chamber to the mold cavities). The molding compound is forced into the mold cavities by applying a transfer pressure, which is maintained for a time needed to ensure complete filling of the mold cavities.

Once the mold cavities have been filled, a packing pressure and a mold temperature are applied. The mold temperature should be high enough to ensure rapid curing of the part, but low enough to prevent "pre-cure" or solidification of the molding compound before it reaches the mold cavities. Following curing, the mold is opened and the encapsulated leadframe is removed via ejector pins. The encapsulated leadframe may then be post-cured at a temperature somewhat lower than the mold temperature, but well above the room temperature, for several hours to complete the curing process. For example, the encapsulated leadframe may be postcured for about 4 hours to about 16 hours at a temperature of about 175° C. Note, however, that the various temperatures, pressures and times described herein are merely exemplary and may vary dependent on the particular molding compound used.

As noted above, the molding compound should be substantially transparent to the wavelength (or wavelengths) of light detected by or emitted from the encapsulated optical devices.

Certain properties of the transfer molding compound may be enhanced by including one or more active or inert ingredients, such as curing agents, accelerators, fillers, coupling agents, flame retardants, stress-relief additives or mold-release agents. For example, the transfer molding compound may include one or more active or inert ingredients for increased mechanical strength, adhesion to package components and/or resistance to environmental factors (e.g., chemical, electrical, thermal and/or moisture). In some cases, active or inert ingredients may be included to substantially match a coefficient of thermal expansion of the transfer molding compound to that of materials it interfaces with (such as, e.g., leadframe 30). In this manner, cracking or other defects may be substantially prevented within the encapsulated package.

Figure 4:
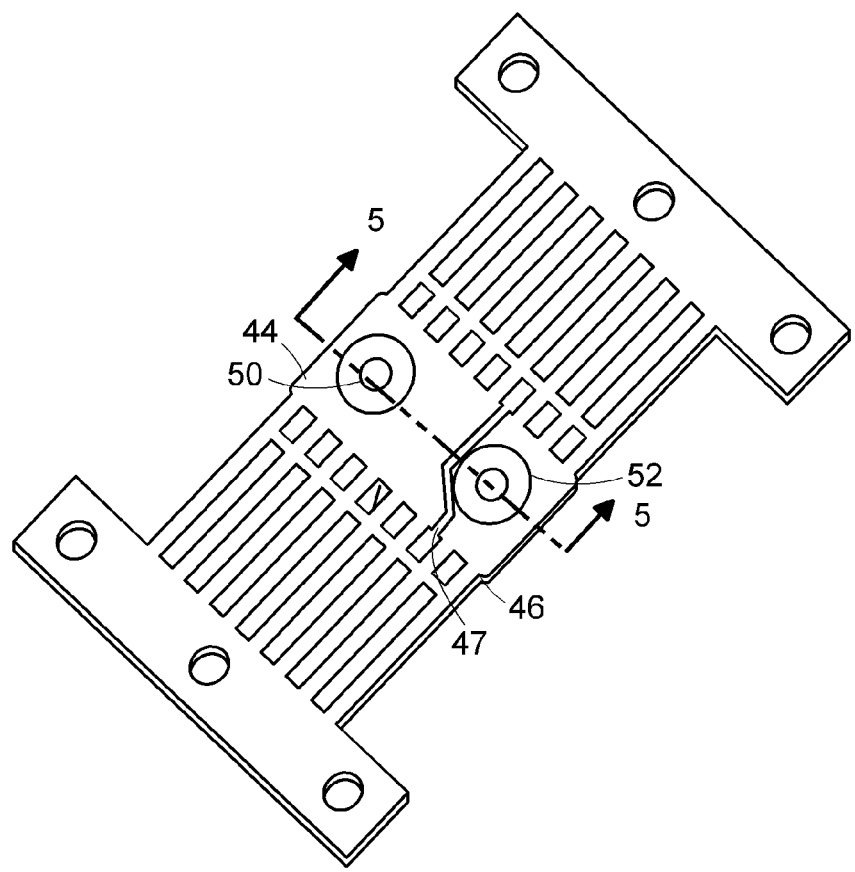
FIG. 4 is a top-view of the separately encapsulated portions of the device-coupled leadframe after the molding process of FIG. 3.
Figure 5:
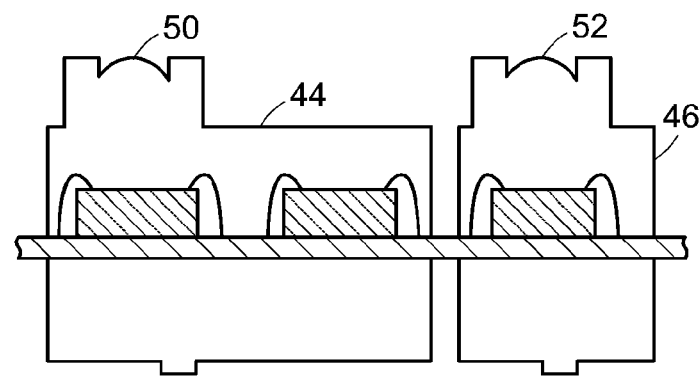
FIG. 5 is a cross-sectional view of the separately encapsulated portions of the device-coupled leadframe, as viewed along plane 5 of FIG. 4.

FIGS. 4 and 5 illustrate the pair of separately encapsulated optoelectronic devices 44 and 46 formed as a result of the first molding process of FIG. 3. As shown in FIG. 4, the pair of separately encapsulated devices 44 and 46 are laterally spaced from one another by air gap 118. In the exemplary embodiment of FIG. 4, air gap 47 is illustrated as having a zig-zag configuration. However, air gap 118 may alternatively demonstrate any other configuration that maintains adequate separation between encapsulated devices 44 and 46.

As shown in FIGS. 4 and 5, each of encapsulated devices 44 and 46 includes a lens (i.e., lens 50 or 52). In a preferred aspect of the present invention, lenses 50 and 52 are formed as a result of the first molding process, as opposed to being separately fabricated and thereafter coupled to encapsulated devices 44 and 46. As such, lenses 50 and 52 are integrated into the same unibody structure as devices 44 and 46, during the injection molding and cure process. Lenses 50 and 52 are thereby formed from the same optically transmissive material used to encapsulate the paired optical and electrical devices. As a result of the first molding process, lenses 50 and 52 are fixed in relation to the underlying optical devices. By forming lenses 50 and 52 in such a manner, the present method provides an easier and more accurate means by which to passively align lensing elements to underlying optical devices.

By forming lenses 50 and 52 in such a manner, the present method may also provide increased optical coupling between the lenses and the underlying optical devices, as compared to conventional optical packages. In the conventional package described by U.S. Pat. No. 5,337,398, for example, a lens is mounted a spaced distance away from a sensing surface of an optical detector. For an optical signal to reach this sensing surface, it must pass through several mediums typically having different indices of refraction. In particular, the optical signal must pass through a lens and an air gap before reaching the sensing surface. Unless the refractive index of the lens is identical to that of air (or any other material within the gap), the optical signal will be refracted, or directed away from, its previous path. Depending on the amount of refraction, the majority of the optical signal may or may not be detected at the sensing surface of the optical detector.

By forming a pair of lenses according to the present method, however, the optical signal must pass through only one medium (i.e., the optically transmissive material) before reaching the sensing surface of an encapsulated optical detector. The medium has a defined thickness in accordance with the inside dimensions of the mold cavity and the optical component surface. Thus, refraction due to index mismatch is substantially eliminated by the present method, thereby enabling the encapsulated optical detector to receive a majority of the optical signal. Lenses 50 and 52 are spaced a defined, and fixed, focal distance away from an underlying optical device, and formed having a radius of curvature that allows a maximum amount of light to be emitted or detected at the operational wavelengths of the underlying optical devices. In this manner, the present method may provide maximum optical coupling between the lenses and the underlying optical devices.

Figure 6:
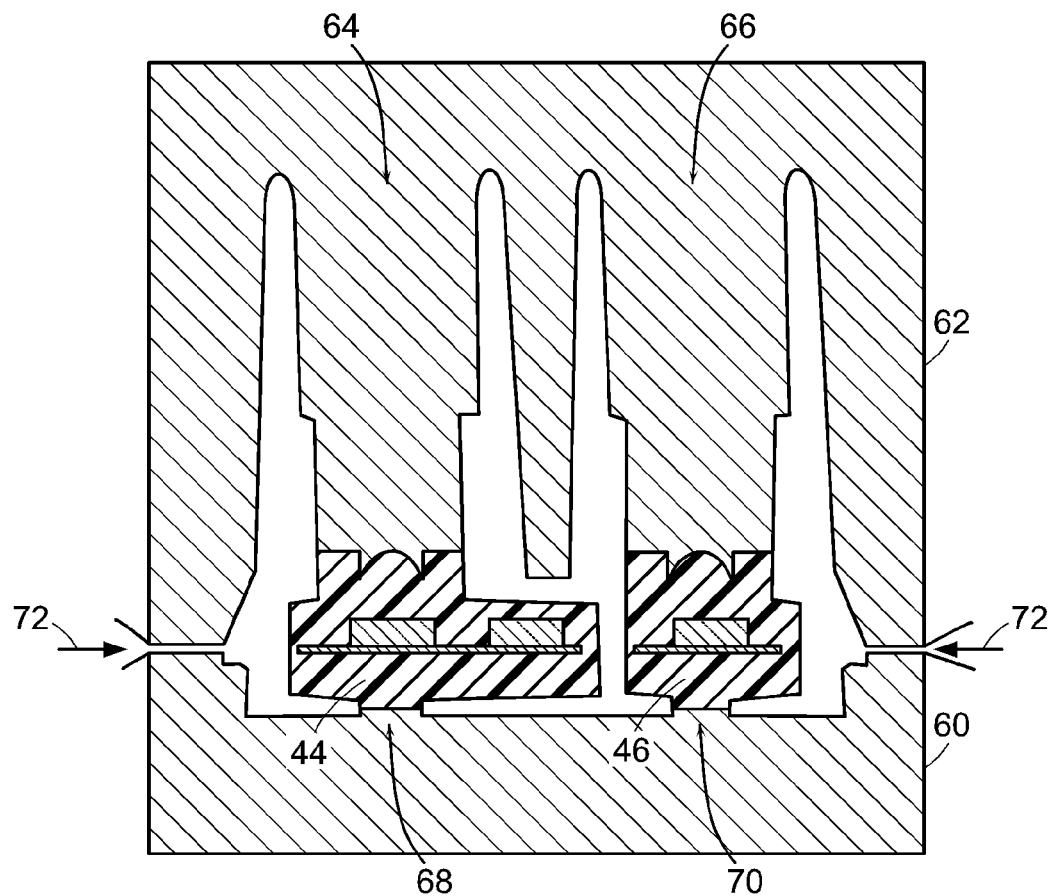
FIG. 6 is a cross-sectional view of the separately encapsulated portions inserted within a second mold for encapsulating the separately encapsulated portions with an optically opaque material to form an encapsulated semiconductor package.

In a subsequent step of the present method, leadframe 30 (having separately encapsulated devices 44 and 46 mounted thereon) is inserted within a second mold, as shown in FIG. 6. In some cases, the leadframe and encapsulated devices may be loaded into bottom half 60 of the second mold. The top half 62 of the second mold may be lowered, and a clamping pressure applied, to secure the leadframe and encapsulated devices within the mold. As shown in FIG. 6, top half 62 preferably includes upper pins 64 and 66 that extend downward. When the second mold is closed, upper pins 64 and 66 provide a downward force upon an uppermost surface of encapsulated devices 44 and 46. Thus, upper pins 64 and 66 are configured to protect the upper-most surface (i.e., the lens area) of the encapsulated devices during a second molding process. In some cases, lower pins 68 and 70 may be included within bottom half 60 to counteract the downward force created by the upper pins.

After the second mold is closed, an optically opaque material is injected, as shown by arrow 72, into a mold cavity arranged around and between encapsulated devices 44 and 46 to form the optically opaque portion. In a preferred aspect of the present invention, the optically opaque material substantially prevents transmission of the wavelength (or wavelengths) of light detected (or emitted) by the encapsulated optical devices. The optically opaque material is suitable for use within a relatively high-pressure, high-temperature molding process, such as an injection molding process. In the injection molding process, a solid molding compound (in either powder or granular form) is fed into a plasticating extruder where pressure and temperature are applied to liquefy the molding compound. The molten compound, now having a relatively high temperature, is forced into the cavity of the second mold under a relatively high pressure. In most cases, the high injection pressure is maintained until the mold is filled and the molten compound has cooled to a substantially solid state. In some cases, additional molding compound may be injected to compensate for changes in compound density during the solidification process. The mold is opened after cooling and the molded part is removed via ejector pins and transferred to an oven for post-curing.

In most cases, the optically opaque, second molding compound is selected from a variety of thermoplastic polymers such as, e.g., polysulphones, polyethersulfones and/or polyethermides. In general, the second molding compound is typically selected for its ability to withstand the higher temperatures and pressures associated with the injection molding process. The second molding compound may also be selected for tolerating higher solder re-flow temperatures (e.g., approximately 212° C. or higher). As such, the second molding compound may prevent "popcorning" or cracking within the molded package caused by internal stresses generated by fluctuations in the solder re-flow temperature profile. In a preferred embodiment, the second molding compound is a liquid crystal polymer. In such an embodiment, an operating temperature threshold (e.g., approximately 38° C.) of semiconductor package 10 may be significantly greater than a threshold of most conventional packages (typically about 22° C.).

In a less preferred embodiment, the second molding process may be a transfer molding process, as opposed to an injection molding process. In such an embodiment, the second molding compound may be injected into the second mold according to the process described above in FIG. 3. Also, the first molding process may be an injection molding process, as opposed to a transfer molding process. As noted above, however, injection molding generally involves temperatures and pressures, which are substantially higher than those involved in transfer molding. Therefore, it is generally preferred that the first molding process be a transfer molding process, so that damage to internal electrical leads (referred to as wire sweep) is substantially prevented. Such damage is often caused by the relatively high temperatures and pressures involved in the injection molding process.

Figure 7:
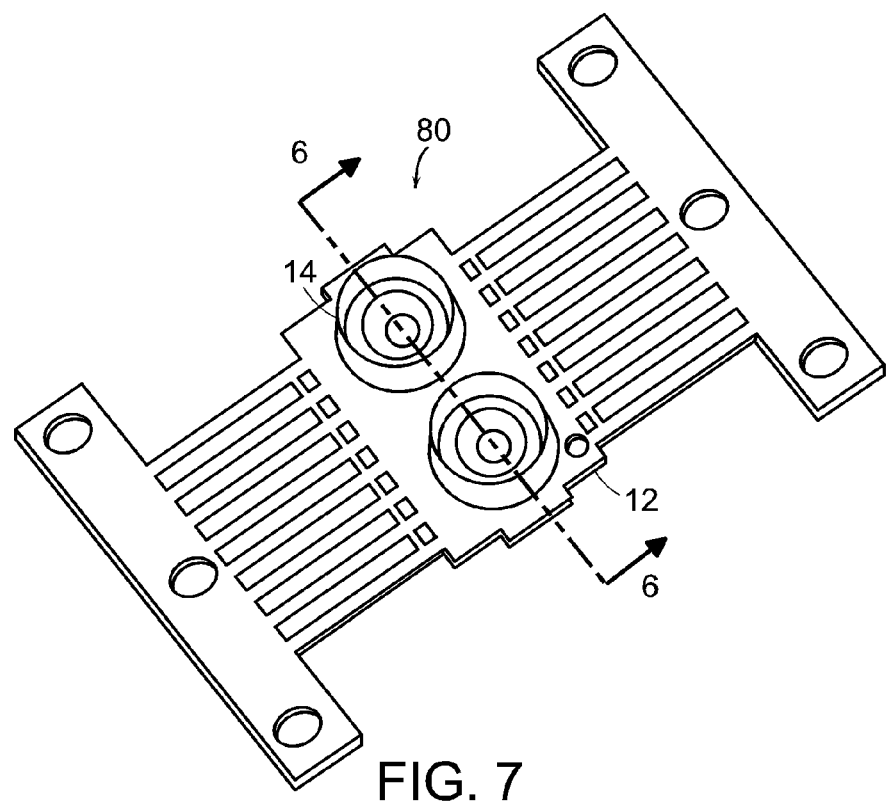
FIG. 7 is a top-view of the encapsulated semiconductor package after the molding process of FIG. 6.
Figure 8:
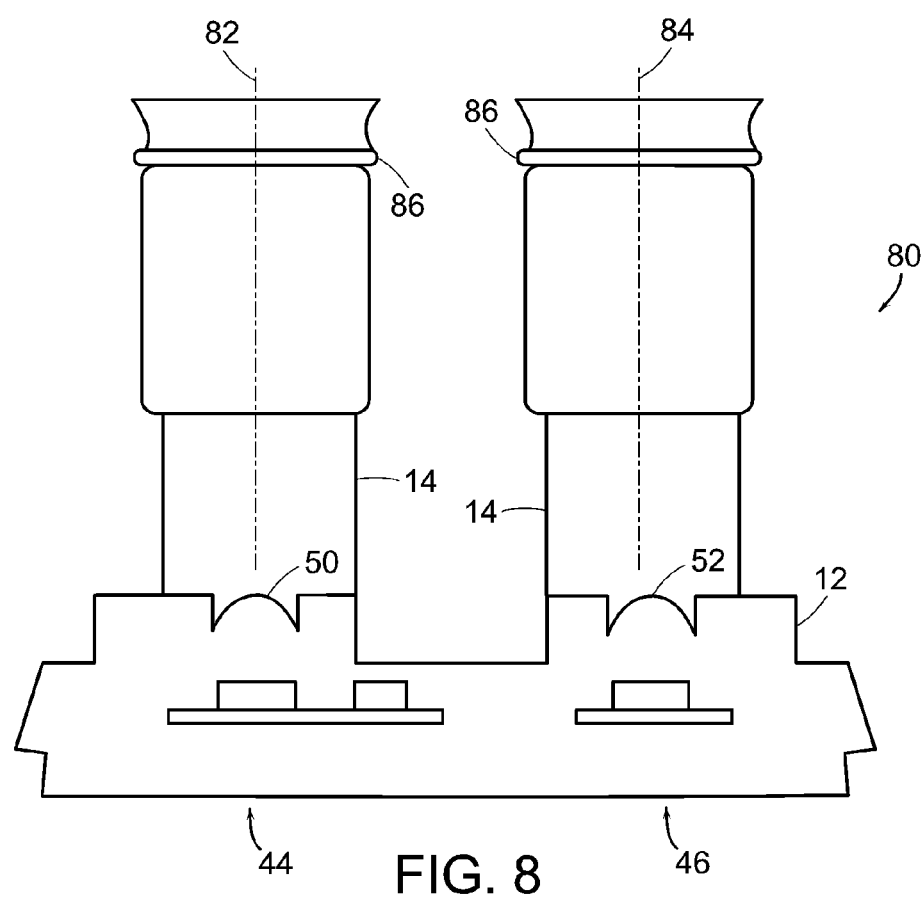
FIG. 8 is a cross-sectional view of the encapsulated semiconductor package, as viewed along plane 6 of FIG. 7.

FIG. 7 illustrates optically opaque portion 80 formed as a result of the second molding process of FIG. 6. In a preferred aspect of the present invention, optically opaque portion 80 extends around and between the pair of separately encapsulated devices 44 and 46, as shown in FIG. 8. More specifically, optically opaque portion 80 partially surrounds each encapsulated device (with the exception of an upper surface, or lens area, of each device) to fill a space therebetween. In this manner, optically opaque portion 80 provides optical isolation between the pair of separately encapsulated devices 44 and 46.

In some cases, a lower surface of each encapsulated device may not be completely covered by optically opaque portion 80, due to the force applied by lower pins 68 and 70 during the second molding process. It is highly unlikely, however, that an optical signal incident upon an upper surface of encapsulated devices 44 and 46 could be transmitted through the encapsulated devices to emerge from these uncovered lower surfaces. As such, optically opaque portion 80 is configured to provide maximum (e.g., 99% or better) cross-talk rejection between the encapsulated devices and surrounding electronic circuitry.

As shown in FIGS. 7 and 8, optically opaque portion 80 includes housing 12 and a pair of cylindrical receptacles 14. More specifically, optically opaque portion 80 extends around encapsulated devices 44 and 46 to form housing 12. Optically opaque portion 80 also extends outward from housing 12 to form the pair of cylindrical receptacles 14. By forming cylindrical receptacles 14 as a unibody structure with housing 12, the present method provides a semiconductor package having a greater structural rigidity than possible with conventional packages. The present method also avoids the additional assembly operations required to form conventional packages by eliminating the need to adhere the receptacle and housing components. In addition, cylindrical receptacles 14 are formed having elongated axes 82 and 84, which extend through a central region of lenses 50 and 52, respectively. By forming the pair of cylindrical receptacles 14 in such a manner, the present method provides an easier and more accurate means by which to passively align the pair of cylindrical receptacles to the respective pair of lenses.

As shown in FIG. 8, each of cylindrical receptacles 14 is adapted to secure an optical conductor in alignment over the upper surface, or lens area, of each encapsulated device 44 and 46. In particular, an inner surface of cylindrical receptacles 14 is formed to include a detent, such as detents 86, for palpable connection with a terminal end of a fiber optic connector (such as, e.g., fiber optic connectors 16 of FIG. 1). In this manner, detents 86 are configured for securely mating fiber optic connectors 16 within cylindrical receptacles 14, thereby ensuring precise optical alignment between optical conductors and the pair of encapsulated optical devices. Detents 86 are also configured for preventing contamination within cylindrical receptacles 14.

Figure 9:
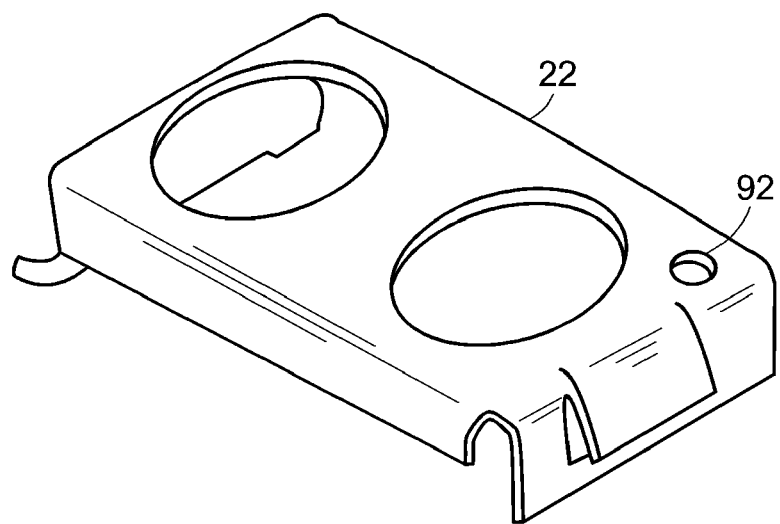
FIG. 9 is an exploded, perspective view of a sheathing being fitted upon an outer surface of the encapsulated semiconductor package.
Figure 9:
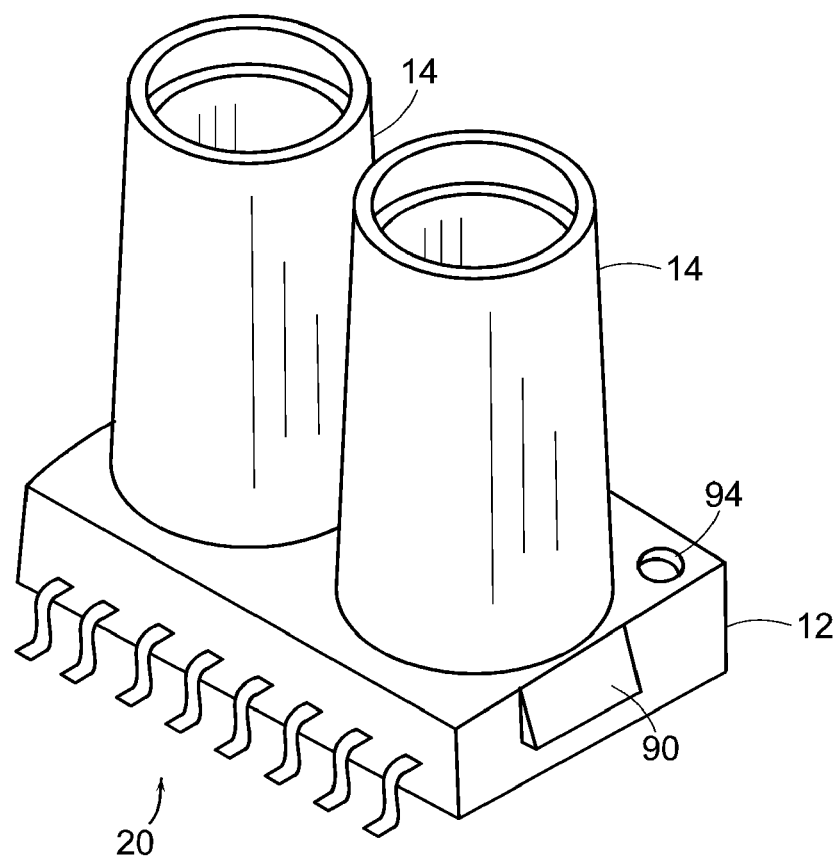

After the second molding process of FIG. 6, semiconductor package 10 is removed from leadframe 30 to form package leads 20, as shown in FIG. 7. Though package leads 20 are shown in FIG. 7 as configured for a surface mount connection, leads 20 may alternatively be configured for a thru-hole or wirebond connection. In some cases, sheathing 22 may be brought over an outer surface of the pair of cylindrical receptacles 14, as shown in FIG. 9. As such, sheathing 22 may protect semiconductor package 10 from any electromagnetic interference (EMI) possibly generated by external circuitry. In one example, sheathing 22 is attached to the semiconductor package by snapping onto one or more wedge-like protrusions 90 formed on the side surfaces of housing 12. Alternative means of attaching sheathing 22 to semiconductor package 10 are also possible.

Sheathing 22 may be formed of substantially any rigid, electrically conductive material, such as a metal. Sheathing 22 may also be formed to include one or more tabs 23 (shown in FIG. 1) for securely attaching semiconductor package 10 to external circuitry, such as a printed circuit board. As shown in FIG. 1, for example, tabs 23 may extend outward from, and substantially flush with, a lower surface of housing 12. In this manner, sheathing 22 may significantly increase the structural rigidity of the semiconductor package by diverting mechanical forces around rather than through the package. In some cases, sheathing 22 may also include a small aperture 92, through which an upwardly protruding button-shaped portion 94 of housing 12 may be inserted upon attachment of sheathing 22 to semiconductor package 10. In such a case, button-shaped portion 92 may be used for pin identification in lieu of, or in addition to, other markings on the semiconductor package.

It will be appreciated to those skilled in the art having the benefit of this disclosure that this invention is believed to provide a semiconductor package having an optically transmissive portion, which separately encapsulates a pair of optoelectronic devices, and an optically opaque portion, which encapsulates the optically transmissive portion to optically isolate the pair of optoelectronic devices. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A semiconductor package, comprising:
   an optically transmissive material that comprises a thermosetting polymer having a first refractive index;
   a first receptacle comprising a first portion of an optically opaque material having a second refractive index greater than the first refractive index, wherein the first receptacle partially surrounds the optically transmissive material, and is adapted to secure an optical conductor in alignment over a portion of the optically transmissive material absent any optically opaque material immediately adjacent thereto;

a first integrated circuit mounted to a first portion of a leadframe, both of which are at least partially surrounded by the optically transmissive material, wherein the portion of the optically transmissive material absent any optically opaque material immediately adjacent thereto comprises a lens, and wherein a surface of the first integrated circuit is spaced from a top surface of the lens by a focal length of the lens;

a second optically transmissive material; and a second receptacle comprising a second portion of the optically opaque material partially surrounding the second optically transmissive material and adapted to secure a second optical conductor in alignment over a portion of the second optically transmissive material absent any optically opaque material immediately adjacent thereto.

2. The semiconductor package as recited in claim 1, wherein the first integrated circuit is an optoelectronic receiver or transmitter having a surface super adjacent the portion of the optically transmissive material absent any optically opaque material immediately adjacent thereto.

3. The semiconductor package as recited in claim 1, wherein the optically transmissive material and the second optically transmissive material are spaced from each other by a third portion of the optically opaque material.

4. The semiconductor package as recited in claim 1, further comprising:

a second integrated circuit mounted to a second portion of the leadframe, which is laterally spaced from the first portion, and surrounded by the second optically transmissive material.

5. The semiconductor package as recited in claim 4, wherein the first integrated circuit is an optoelectronic receiver and the second integrated circuit is an optoelectronic transmitter.

6. A semiconductor package, comprising:

a leadframe;

a pair of optical devices spaced from each other and coupled to the leadframe;

an optically transmissive portion that separately encapsulates each of the pair of optical devices;

an optically opaque portion that extends between the separately encapsulated pair of optical devices and also extends outward from a portion of each of the separately encapsulated pair of optical devices to form a pair of cylindrical receptacles having elongated axes aligned over the pair of optical devices; and wherein an inner surface of each of the pair of cylindrical receptacles comprise a detent for palpable connection with a terminal end of a fiber optic connector.

7. The semiconductor package as recited in claim 6, further comprising a substantially rigid sheathing having a pair of apertures that can be brought over an outer surface of the pair of cylindrical receptacles and snap fit upon an outer surface of the optically opaque portion from which the receptacles extend.

8. The semiconductor package as recited in claim 7, wherein the sheathing comprises a metal material configured to provide structural rigidity and electromagnetic shielding to the semiconductor package.

9. The semiconductor package as recited in claim 7, wherein the sheathing comprises a set of tabs extending outward from and substantially flush with an outer surface of the optically opaque portion, which is opposite from the receptacles, for attachment to a printed circuit board.

10. The semiconductor package as recited in claim 6, wherein the portion of each of the separately encapsulated pair of optical devices comprises a pair of lenses that are in optical alignment with the respective pair of optical devices and are formed as a unibody structure with the optically transmissive portion.

11. The semiconductor package as recited in claim 10, wherein the elongated axes extend through a central region of the respective pair of lenses, and wherein the pair of cylindrical receptacles is formed as a unibody structure with the optically opaque portion.

12. The semiconductor package as recited in claim 6, wherein the pair of optical devices comprises an optoelectronic transmitter and receiver.

13. The semiconductor package as recited in claim 12, wherein the optoelectronic transmitter comprises a light emitting diode and the optoelectronic receiver comprises a photodiode.

14. A method of fabricating a semiconductor package, comprising:

coupling a pair of optical devices onto a surface of a leadframe;

inserting the device-coupled leadframe into a first mold and injecting a substantially light transmissive material around each of the pair of optical devices to form a separately encapsulated pair of optical devices having distal ends of the leadframe exposed; and inserting the leadframe with the separately encapsulated pair of optical devices into a second mold and injecting a substantially light opaque material around each of the separately encapsulated pair of optical devices while filling the space therebetween and forming a pair of receptacles extending outward from one surface of the light transmissive material.

15. The method as recited in claim 14, wherein the step of injecting a substantially light transmissive material comprises a first injection pressure and a first injection temperature, and wherein the step of injecting a substantially light opaque material comprises a second injection pressure and a second injection temperature substantially greater than the first injection pressure and the first injection temperature.

16. The method as recited in claim 14, wherein the step of injecting a substantially light transmissive material is performed during a transfer molding process.

17. The method as recited in claim 14, wherein the step of injecting a substantially light opaque material is performed during an injection molding process.

18. The method as recited in claim 14, further comprising connecting a sheathing around the pair of receptacles and bonding a portion of the sheathing to a printed circuit board.

* * * * *